United States Patent
Iwaki et al.

(10) Patent No.: US 7,567,023 B2
(45) Date of Patent: Jul. 28, 2009

(54) PIEZOELECTRIC THIN-FILM RESONATOR AND FILTER USING THE SAME

(75) Inventors: Masafumi Iwaki, Kawasaki (JP); Jun Tsutsumi, Kawasaki (JP); Tokihiro Nishihara, Kawasaki (JP); Tsuyoshi Yokoyama, Kawasaki (JP); Takeshi Sakashita, Kawasaki (JP); Shinji Taniguchi, Kawasaki (JP); Masanori Ueda, Kawasaki (JP); Go Endo, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 60 days.

(21) Appl. No.: 11/790,806

(22) Filed: Apr. 27, 2007

(65) Prior Publication Data

US 2007/0252476 A1 Nov. 1, 2007

(30) Foreign Application Priority Data

Apr. 28, 2006 (JP) .............................. 2006-127017

(51) Int. Cl.
*H01L 41/08* (2006.01)
(52) U.S. Cl. ...................................... 310/365; 310/324
(58) Field of Classification Search .................. 310/320, 310/324
See application file for complete search history.

(56) References Cited

U.S. PATENT DOCUMENTS

| | | | | |
|---|---|---|---|---|
| 5,075,641 A | * | 12/1991 | Weber et al. ............ | 331/108 C |
| 6,914,368 B2 | * | 7/2005 | Nakamura et al. .......... | 310/365 |
| 7,187,253 B2 | * | 3/2007 | Sano et al. ................. | 333/187 |
| 7,221,242 B2 | * | 5/2007 | Asai et al. ................... | 333/187 |
| 7,304,412 B2 | * | 12/2007 | Philliber ..................... | 310/324 |
| 7,382,078 B2 | * | 6/2008 | Bradley ...................... | 310/320 |
| 2005/0269904 A1 | | 12/2005 | Oka | |

FOREIGN PATENT DOCUMENTS

| | | |
|---|---|---|
| JP | 60-189307 A | 9/1985 |
| JP | 2003273693 A | 9/2003 |
| JP | 2004-200843 A | 7/2004 |
| JP | 2005073175 A | 3/2005 |
| JP | 2005124107 A | 5/2005 |
| JP | 2007295307 A | 11/2007 |
| KR | 10-2006-0049516 A | 5/2006 |

OTHER PUBLICATIONS

K. Nakamura, et al., "ZnO/SiO$_2$-Diaphragm Composite Resonator on a Silicon Wafer," Electronic Letters, 1981, vol. 17, pp. 507-509.

* cited by examiner

*Primary Examiner*—Mark Budd
(74) *Attorney, Agent, or Firm*—Arent Fox LLP.

(57) ABSTRACT

A piezoelectric thin-film resonator includes a substrate, a lower electrode provided on the substrate, a piezoelectric film provided on the lower electrode, and an upper electrode provided on the piezoelectric film so as to have a portion that overlaps the lower electrode across the piezoelectric film. At least a part of an outer end of the piezoelectric film is further in than an outer end of an opposing region in which the upper and lower electrodes overlap each other across the piezoelectric film.

13 Claims, 16 Drawing Sheets

COMPARATIVE EXAMPLE

EMBODIMENT

PIEZOELECTRIC THIN-FILM RESONATOR AND FILTER USING THE SAME

BACKGROUND OF THE INVENTION

1. Field of the Invention

The present invention generally relates to piezoelectric thin-film filters and filters using the same.

2. Description of the Related Art

Recently, there has been an increasing demand for filters with compact and light resonators and filters configured by combining these filters as wireless communication equipment that may be typically cellular phones has spread rapidly. In the past, dielectric filters or surface acoustic wave (SAW) filters were mainly used. Nowadays, piezoelectric thin film resonators and filters using these resonators are attracting attention, in which the piezoelectric thin film resonators are characterized in that they gave good high-frequency performance and are compact and producible as a monolithic device.

The piezoelectric thin-film resonators may be categorized into an FBAR (Film Bulk Acoustic Resonator) type and an SMR (Solidly Mounted Resonator) type. Japanese Patent Application Publication No. 60-189307 and Japanese Patent Application Publication No. 2004-200843 disclose piezoelectric thin-film resonators of FBAR type. FIG. 1 show a conventional FBAR type resonator and a conventional SMR type resonator in parts (a) and (b), respectively. A lower electrode 12, a piezoelectric film 14 and an upper electrode 16 are laminated in this order on a substrate 10 having a cavity 18 or an acoustic multilayer film. The cavity 18 or acoustic multilayer film is formed below an overlapping portion in which the upper electrode 16 and the lower electrode 12 overlap each other across the piezoelectric film 14. Such a portion is referred to as a resonance portion 22. The cavity 18 in the FBAR may be formed by dry or wet etching from the backside of the substrate 10, which may be made of silicon. The cavity 18 may be formed so as to be positioned between the lower electrode 12 and the substrate 10 by removing a sacrificed layer provided on the surface of the silicon substrate 10 by wet etching. In this case, the cavity 18 may be called a gap. The acoustic multilayer film in the SMR has first layers having a relatively high acoustic impedance and second layers having a relatively low acoustic impedance so as to be laminated alternately to a thickness equal to $\lambda/4$ where $\lambda$ is the wavelength of an acoustic wave of the resonator.

The upper and lower electrodes 12 and 16 may be made of aluminum (Al), copper (Cu), molybdenum (Mo), tungsten (W), tantalum (Ta), platinum (Pt), ruthenium (Ru), rhodium (Rh), iridium (Ir) or the like. The piezoelectric thin film 14 may be made of aluminum nitride (AlN), zinc oxide (ZnO), lead zirconium titanate (PZT), lead titanate (PbTiO$_3$) or the like. The substrate 10 may be made of glass other than silicon.

The piezoelectric thin-film resonator of FBAR or BAW type has a loss caused by leak acoustic waves 30 propagated outwards from the resonance portion 22, as shown in parts (a) and (b) of FIG. 1. Portions that are located further out than the resonance portion 22 are referred to as non-resonance portions. The leak acoustic waves 30 propagated through the non-resonance portions are not converted into electric signals and cause a loss. This phenomenon is called lateral leakage of the acoustic wave 30. One of factors that cause the lateral leakage of the acoustic wave 30 is the difference in the acoustic velocity between the resonance portion 22 and the non-resonance portions. In other words, there is a factor that depends on the Poisson's ratio of the piezoelectric film 14. When the Poisson's ratio of the piezoelectric film 14 is equal to or greater than 1/3, the acoustic velocity in the resonance portion 22 is less than the acoustic velocities in the non-resonance portions. When the Poisson's ratio is less than 1/3, the acoustic velocity in the resonance portion 22 is greater than the acoustic velocities in the non-resonance portions. For the piezoelectric film 14 having a Poisson's ratio of 1/3 or greater, an appropriate mass is applied to the resonance portion 22, so that the acoustic velocity in the resonance portion 22 can be made less than the acoustic velocities in the non-resonance (peripheral) portions and the lateral leakage of the acoustic wave 30 be restrained easily.

However, when the piezoelectric film 14 has a Poisson's ratio of 1/3 or lower, the relation in the acoustic wave in the absence of the lateral leakage is opposite to the above-mentioned relation. Thus, the lateral leakage of acoustic waves cannot be restrained easily. For example, aluminum nitride used for the piezoelectric film 14 has a Poisson's ratio equal to or less than 1/3. Thus, it is difficult to restrain the lateral leakage and thus reduce the loss.

SUMMARY OF THE INVENTION

The present invention has been made in view of the above circumstances and provides a piezoelectric thin-film resonator capable of restraining the lateral leakage of acoustic waves and reducing the loss and a filter using such a resonator.

According to an aspect of the present invention, there is provided a piezoelectric thin-film resonator comprising: a substrate; a lower electrode provided on the substrate; a piezoelectric film provided on the lower electrode; and an upper electrode provided on the piezoelectric film so as to have a portion that overlaps the lower electrode across the piezoelectric film, at least a part of an outer end of the piezoelectric film being further in than an outer end of an opposing region in which the upper and lower electrodes overlap each other across the piezoelectric film.

According to another aspect of the present invention, there is provided a piezoelectric thin-film resonator including: a substrate; a lower electrode provided on the substrate; a piezoelectric film provided on the lower electrode; and an upper electrode provided on the piezoelectric film so as to have a portion that overlaps the lower electrode across the piezoelectric film, an inner angle formed by an end surface of the piezoelectric film and a lower surface thereof in an opposing region in which the upper and lower electrodes overlap each other is greater than 90°.

According to a further object of the present invention, there is provided a filter including a resonator that is configured as mentioned above.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given, with reference to the accompanying drawings, of embodiments of the present invention.

First Embodiment

Figure 1:
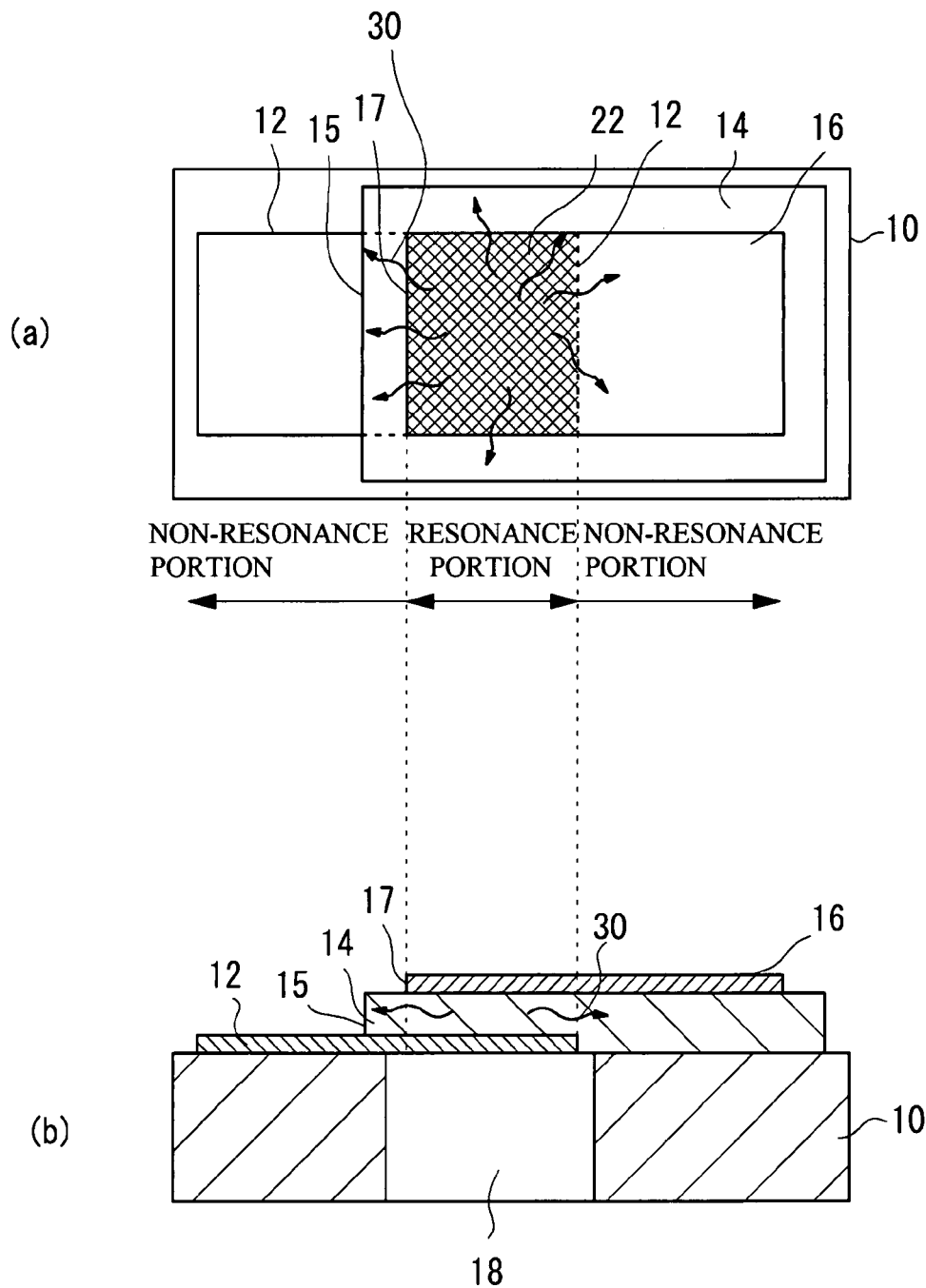
FIG. 1 is a diagram of a conventional piezoelectric thin-film resonator in which part (a) is a plan view of the resonator and part (b) is a cross-sectional view taken along a longitudinal line on the part (a)
Figure 2:
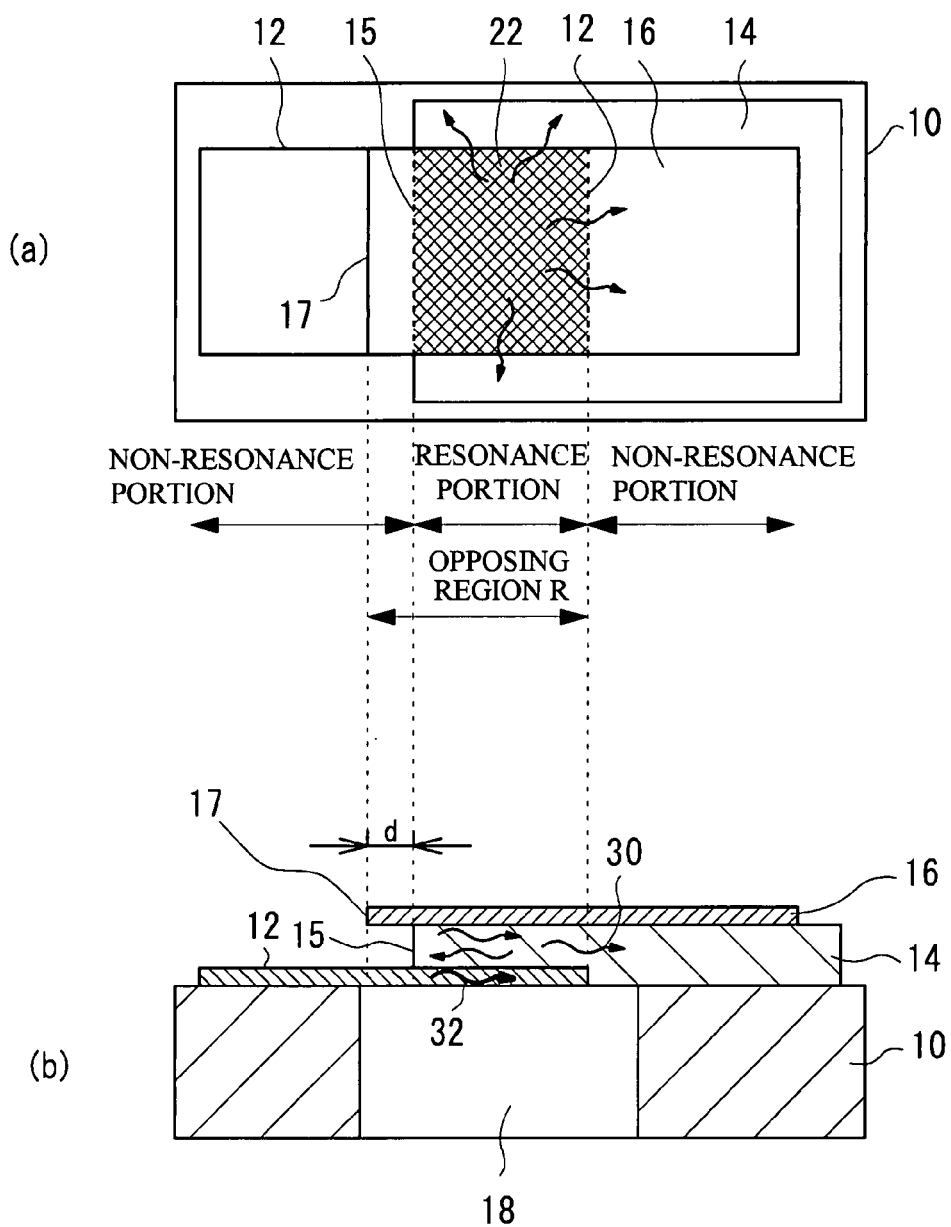
FIG. 2 is a diagram of a piezoelectric thin-film resonator in accordance with a first embodiment of the present invention, in which part (a) is a plan view of the resonator and part (b) is a cross-sectional view taken along a longitudinal line on the part (a)

FIG. 2 shows a piezoelectric thin-film resonator in accordance with a first embodiment. More particularly, part (a) of FIG. 2 is a plan view of the resonator, and part (b) is a cross-sectional view taken along a longitudinal line in part (a).

The lower electrode 12 formed on the silicon substrate 10 has a two-layer structure composed of a Ru film and a Cr film. The piezoelectric film 14, which may be made of AlN, is provided on the lower electrode 12 and the silicon substrate 10. The upper electrode 16, which may be made of Ru, is provided so as to have the overlapping portion (resonance portion) 22 in which the upper electrode 16 overlaps the lower electrode 12 across the piezoelectric film 14. The cavity 18 is formed in the silicon substrate 10 and is located below the resonance portion 22. The cavity 18 may be an acoustic multilayer film.

At least a part of an outer end 15 of the piezoelectric film 14 in the resonance portion 22 (the left-hand side of the resonance portion 22) is further in, by a length d, than an outer end 17 of a region R (the lower surface of the upper electrode 16 in this embodiment) formed by facing the upper electrode 16 and the lower electrode 12 across the piezoelectric film 14.

The end surfaces of the upper electrode 16 and the piezoelectric film 14 are substantially vertical to the lower surface of the piezoelectric film 14.

The lower electrode 12, the piezoelectric film 14 and the upper electrode 16 may be formed by sputtering and etching. A part of the outer end 15 of the piezoelectric film 14 may be formed so as to be further in than the outer end 17 of the upper electrode 16 by forming the piezoelectric film 14 by wet etching with the upper electrode 16 being used as a mask. The cavity 18 may be formed so as to have substantially vertical walls in the silicon substrate 10 by dry etching with a chlorine gas.

Figure 3:
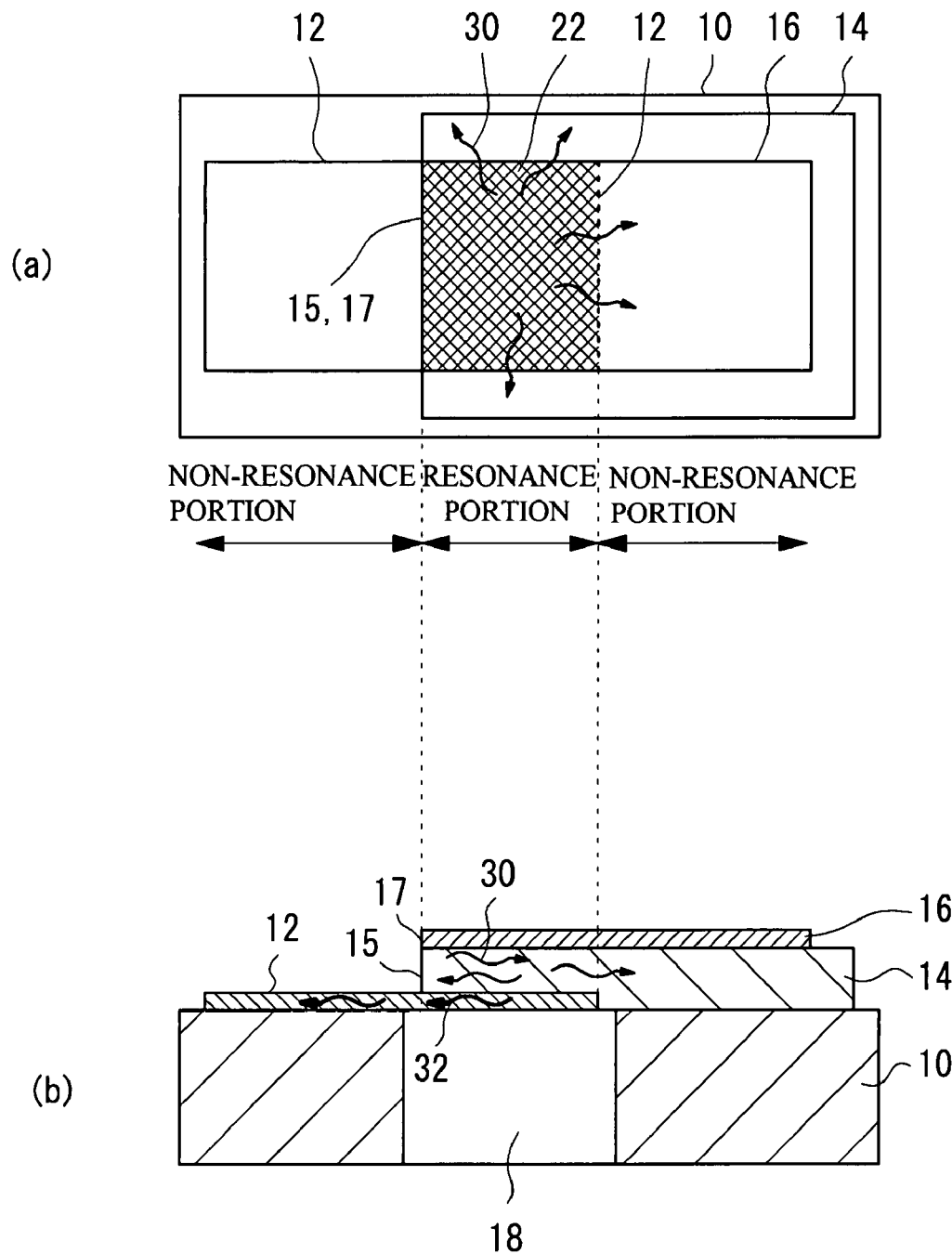
FIG. 3 is a diagram of a comparative piezoelectric thin-film resonator in accordance with a first embodiment of the present invention, in which part (a) is a plan view of the resonator and part (b) is a cross-sectional view taken along a longitudinal line on the part (a)

FIG. 3 shows a comparative example of the piezoelectric thin-film resonator. The comparative example differs from the piezoelectric thin-film resonator of the first embodiment in which the left-side outer end 15 of the piezoelectric film 14 is aligned with the outer end 17 of the upper electrode 16. The other structures of the comparative example are the same as those of the first embodiment, and a description thereof will be omitted here.

Figure 4A:
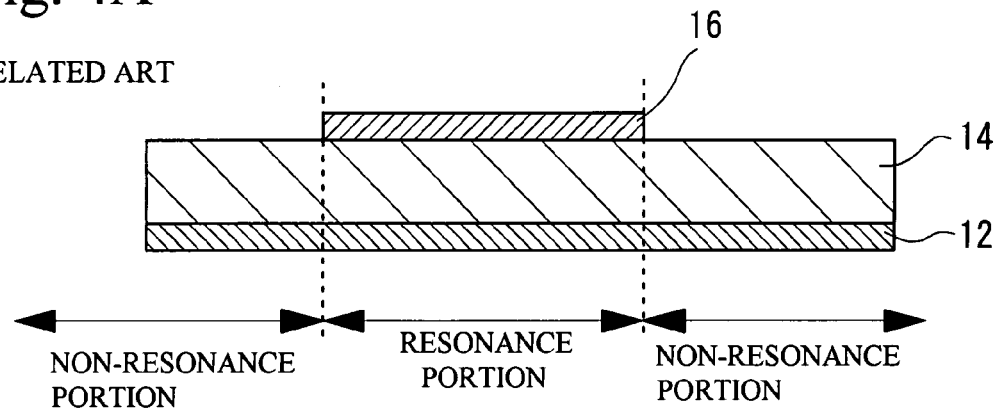
FIGS. 4A, 4B and 4C show models used in a computer simulation conducted by the inventors.
Figure 4B:
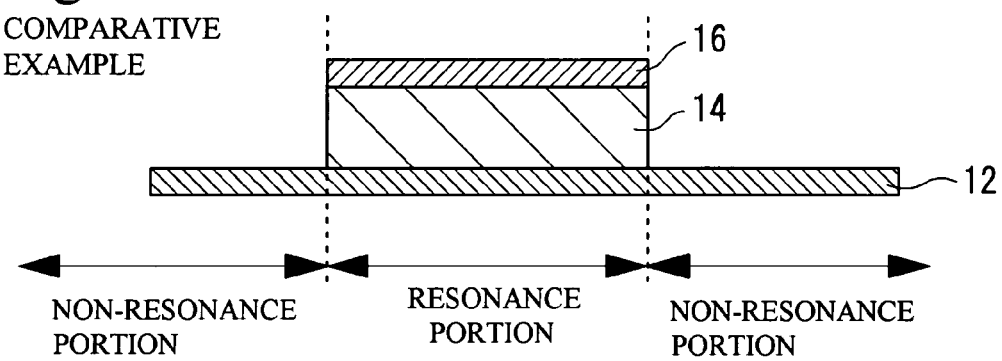
Figure 4C:
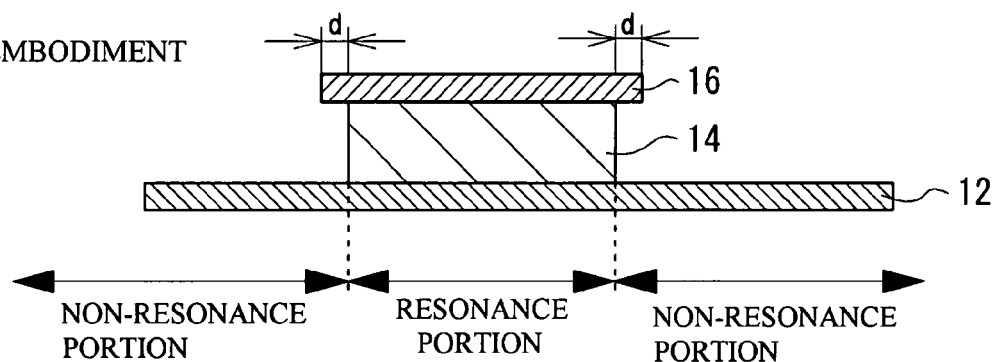

The inventors investigated lateral leakage of acoustic waves in the conventional resonator, the comparative example, and the first embodiment. The inventors prepared models shown in FIGS. 4A, 4B and 4C, and computed the anti-resonance impedances of the models by an FEM (Finite Element Method). FIG. 4A shows a model of the conventional resonator in which the piezoelectric film 14 is provided on the whole upper surface of the lower electrode 12, and the upper electrode 16 is provided on a part of the upper surface of the piezoelectric film 14. FIG. 4B shows a model of the comparative example, in which the ends of the piezoelectric film 14 and the upper electrodes 16 are aligned. FIG. 4C shows a mode of the first embodiment in which the ends of the piezoelectric film 14 are further in than those of the upper electrode 16 by the length d.

Figure 5:
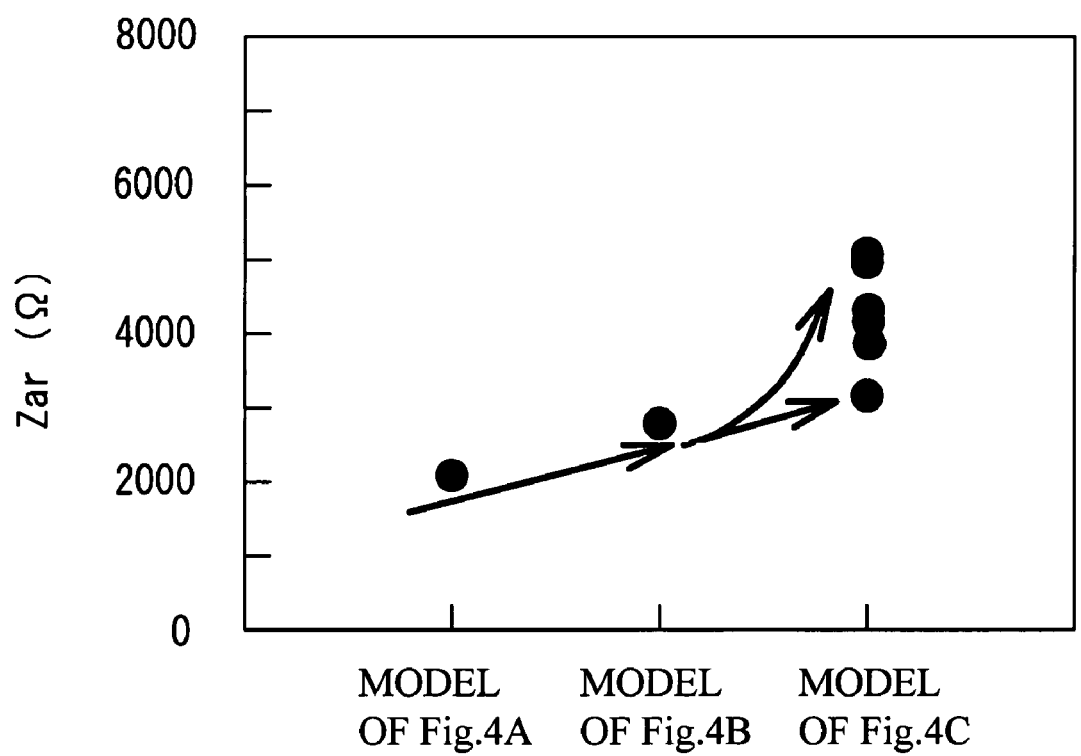
FIG. 5 shows results of the computer simulation for the models shown in FIGS. 4A through 4C.

FIG. 5 shows a graph showing the results of a computer simulation using the FEM. The horizontal axis of the graph indicates the three models, and the vertical axis thereof denotes the anti-resonance impedance Zar. The results of the first embodiment were obtained by changing the length d from 0 to 1.5 μm. As the anti-resonance impedance Zar has a larger value, the lateral leakage of the acoustic waves 30 from the resonance portion 22 to the non-resonance portions is more improved. FIG. 5 shows that the anti-resonance impedance is increased in the order of the conventional resonator, the comparative example, and the first embodiment, and the lateral leakage of the acoustic waves 30 from the resonance portion 22 to the non-resonance portions can be improved significantly.

The inventors consider a mechanism that enables to restrain the lateral leakage of the acoustic waves 30 in the comparative example and the first embodiment. In the comparative example shown in FIG. 3, a part of the outer end 15 of the piezoelectric film 14 is aligned with the outer end 17 of the upper electrode 16. The acoustic waves 30 are reflected by the outer end 15 of the piezoelectric film 14, so that the leakage of the acoustic waves 30 from the resonance portion 22 to the non-resonance portion at the left side of the piezoelectric film 14 can be restrained. However, there are acoustic waves 32 propagated through the lower electrode 12 and leaked to the non-resonance portion. Thus, the lateral leakage of the acoustic waves 30 cannot be restrained greatly. In contrast, the first embodiment shown in FIG. 2, the outer end 15 of the piezoelectric film 14 in the electrode opposing region R is further in than the outer end 17 of the upper electrode 16 in the opposing region R. That is, the upper electrode 16 has a portion that overhangs from the outer end 15 of the piezoelectric film 14. When the overhang portion of the upper electrode 16 is vibrated, unnecessary vibrations of the lower electrode 12 can be restrained. It is thus possible to prevent the acoustic waves 32 from being laterally propagated through the lower electrode 12 in the comparative example.

Second Embodiment

Figure 6:
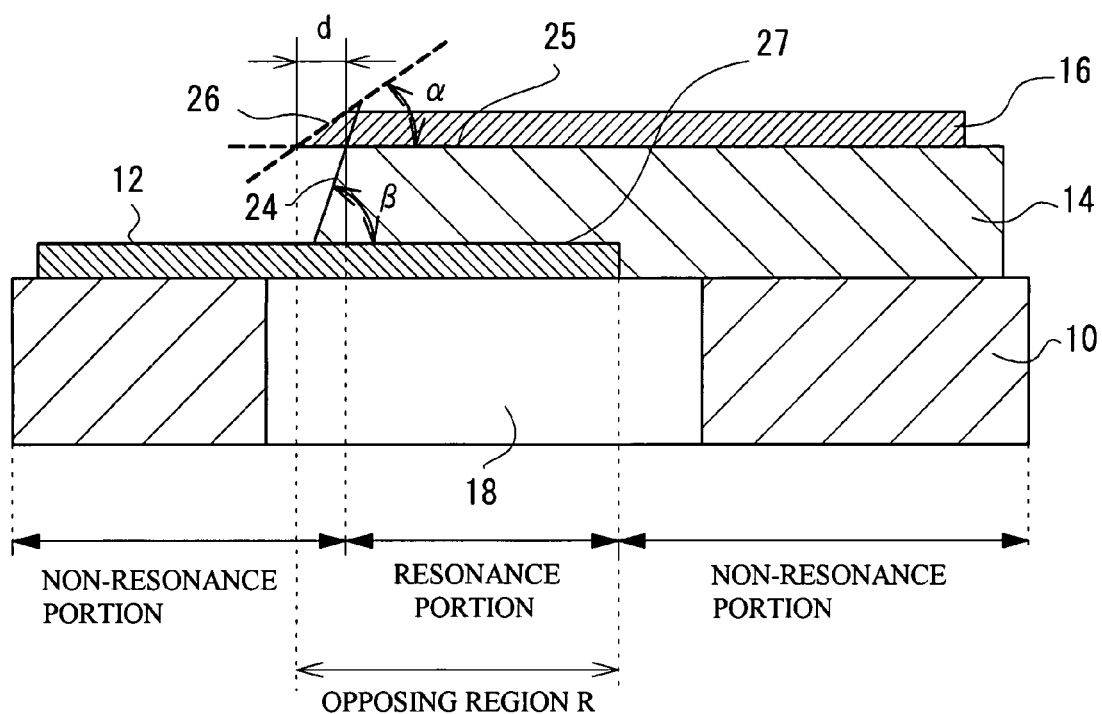
FIG. 6 is a cross-sectional view of a piezoelectric thin-film resonator in accordance with a second embodiment.

Referring to FIG. 6, a second embodiment is a piezoelectric thin-film resonator in which at least a part of an end surface 26 of the upper electrode 16 in the region R defined by overlapping the upper electrode 16 and the lower electrode 12 across the piezoelectric film 14 is inclined to a lower surface 25 of the upper electrode 16. Further, the piezoelectric film 14 has an end surface 24 that is inclined to the lower surface 25 of the upper electrode 16 in the electrode opposing region R. The other structures of the second embodiment are the same as those of the first embodiment. A symbol $\alpha$ is defined as an inner angle between the inclined end surface 26 of the upper electrode 16 and the lower surface 25 thereof. A symbol $\beta$ is defined as an inner angle between the inclined end surface 24 of the piezoelectric film 14 and a lower surface 27 thereof. The symbol d is the distance between the upper end of the end surface 24 of the piezoelectric film 14 and the lower end of the end surface 26 of the upper electrode 16. The end surface 26 of the upper electrode 16 may be shaped into a slope by obliquely etching the upper electrode 16 by ion milling. The end surface 24 of the piezoelectric film 14 can be shaped into a slope that overhangs from the upper end of the piezoelectric film 14 by the length d by wet etching the piezoelectric film 14 in which the upper electrode 16 is used as a mask.

Figure 7:
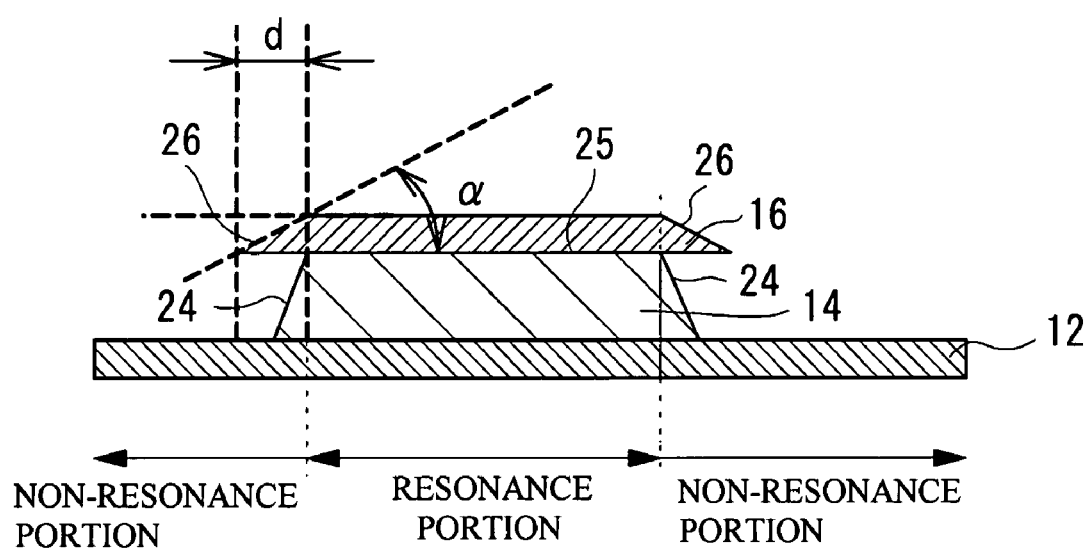
FIG. 7 shows a model used for a computer simulation related to the second embodiment.

The anti-resonance impedance Zar of the second embodiment was computed by FEM. FIG. 7 shows a model of the second embodiment used in the computer simulation. The opposite end surfaces 26 of the upper electrode 16 are inclined to the lower surface 25 of the upper electrode 16. The opposite end surfaces 24 of the piezoelectric film 14 are inclined to the lower surface of the piezoelectric film 14.

FIGS. 8A through 8D and FIGS. 9A through 9D show the results of the computer simulation of the anti-resonance impedance Zar as a function of the distance d (μm) for $\beta$ of 55°. FIGS. 8A through 8D are graphs of the anti-resonance impedance Zar ($\Omega$) as a function of d (μm) for $\alpha$ of 90°, 58°, 40° and 35°, respectively. FIGS. 9A through 9D are graphs of the anti-resonance impedance Zar ($\Omega$) as a function of d (μm) for $\alpha$ of 28°, 25°, 22° and 15°, respectively. When d is equal to 0, the anti-resonance impedance Zar is equal to 2000 $\Omega$ to 3000 $\Omega$. As the distance d increases, the anti-resonance impedance Zar increases from 3000 $\Omega$ to 5000 $\Omega$. The results of the simulation shown in FIGS. 8A through 8D and 9A through 9D show that the anti-resonance impedance Zar tends to increase as the distance d increases regardless of the magnitude of $\alpha$.

Figure 8A:
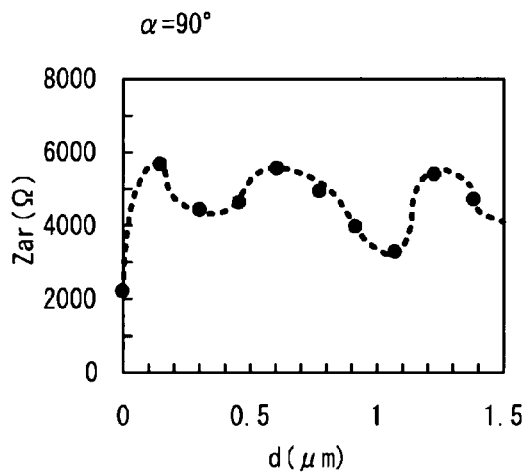
FIGS. 8A through 8D are graphs of anti-resonance impedance Zar as a function of distance d in connection with the second embodiment.
Figure 8B:
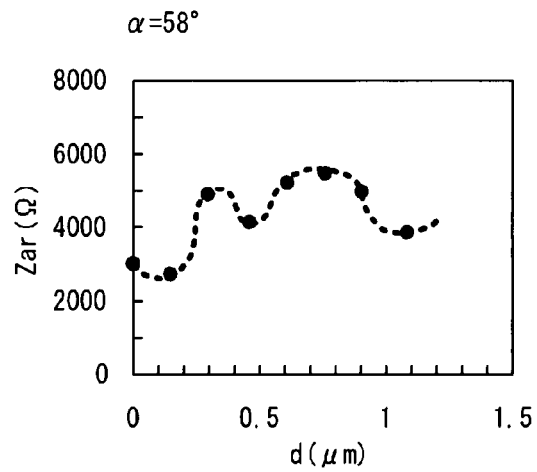
Figure 8C:
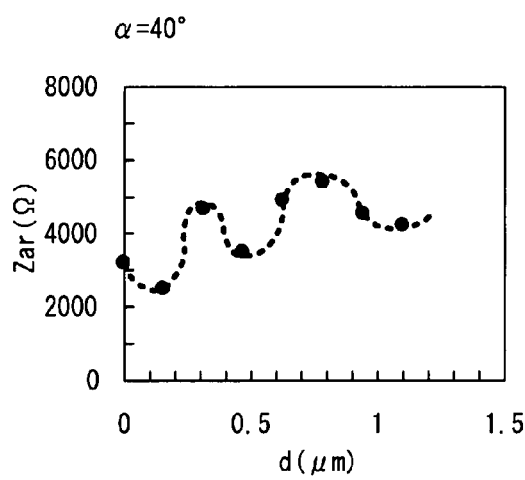
Figure 8D:
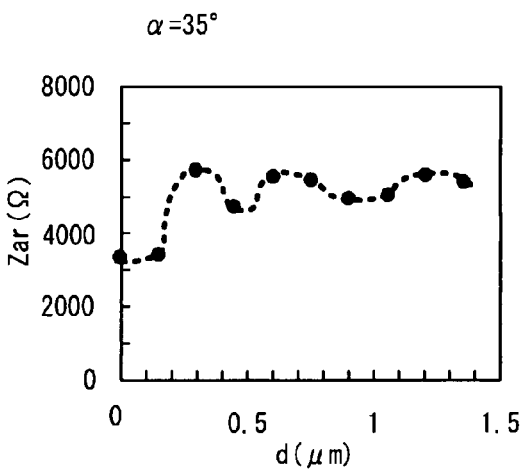
Figure 9A:
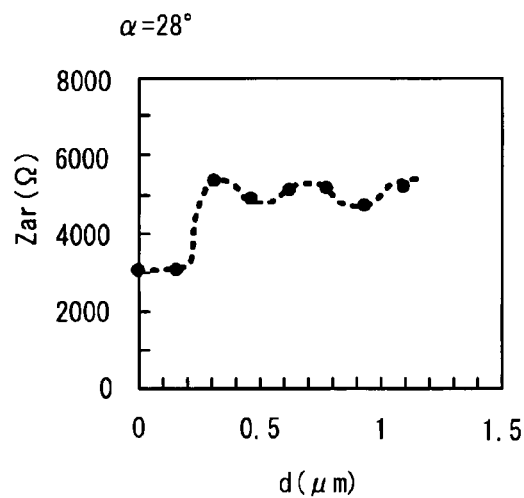
FIGS. 9A through 9D are other graphs of the anti-resonance impedance Zar as a function of distance d in connection with the second embodiment.
Figure 9B:
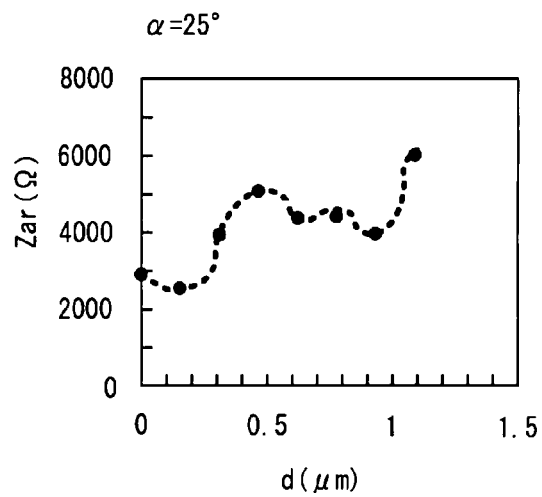
Figure 9C:
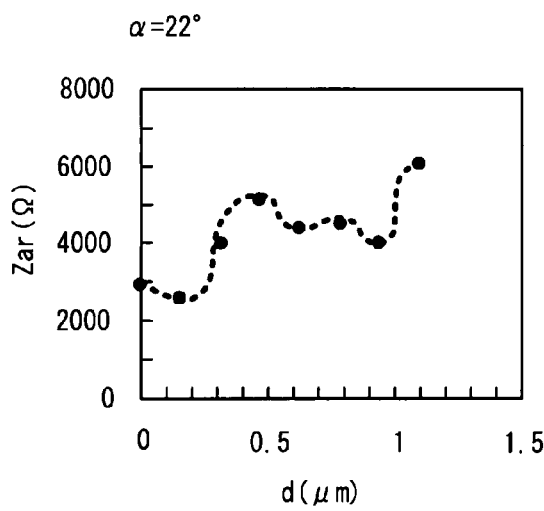
Figure 9D:
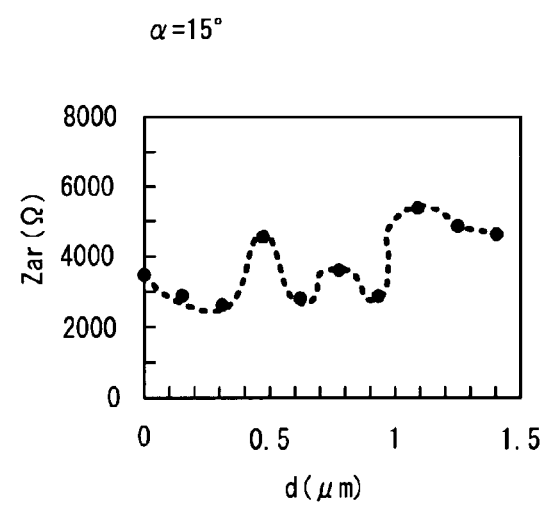

In order to suppress deviations of the anti-resonance impedance Zar caused by deviations of the distance d introduced during the production, preferably, the dependence of Zar on the distance d is small. FIG. 8A shows that the distance d increases from 0, the anti-resonance impedance drastically increases from 2000 $\Omega$ to 6000 $\Omega$. In contrast, it can be seen from the results shown in FIGS. 8B through 9D that the anti-resonance impedance Zar does not have a dependence on the distance d as much as that shown in FIG. 8A. It is therefore preferable that the inner angle $\alpha$ is smaller than 90°.

Figure 10:
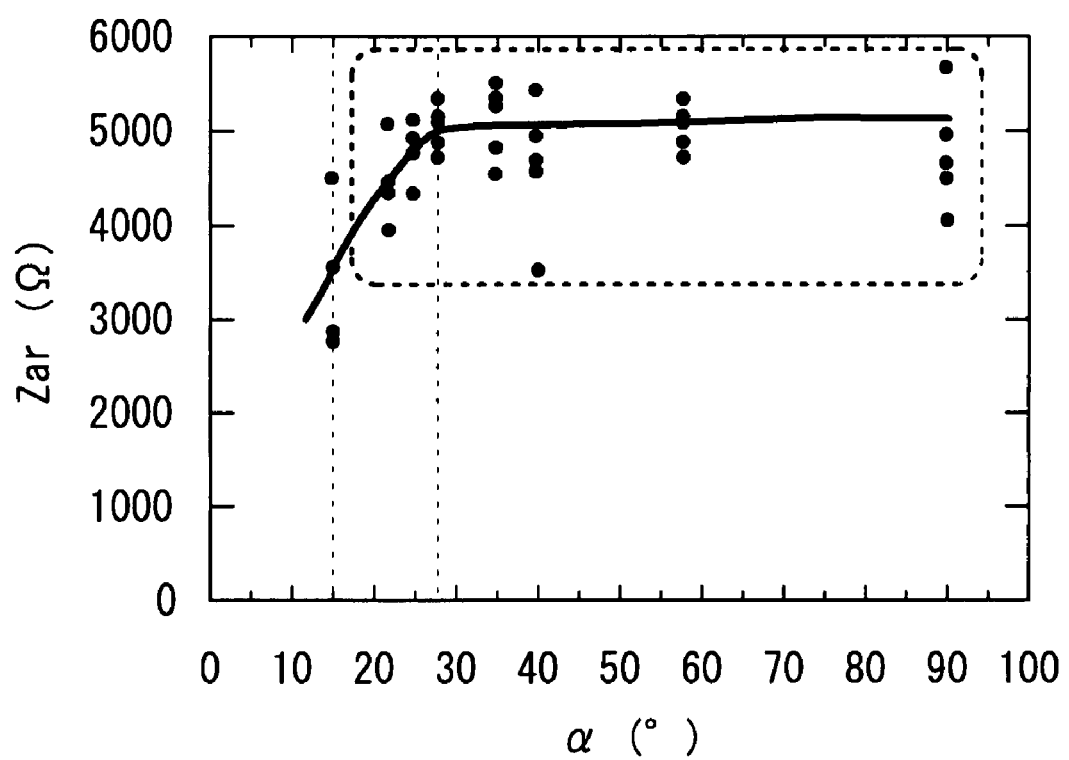
FIG. 10 is a graph of combined results shown in FIGS. 8A through 9D in which the horizontal axis denotes the inner angle α, and the vertical axis denotes the anti-resonance impedance Zar.
Figure 11A:
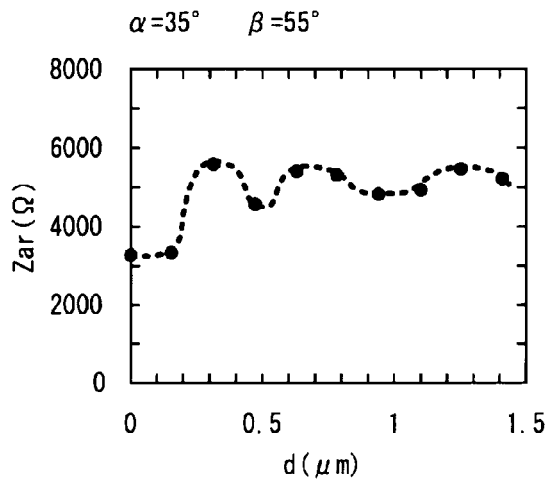
FIGS. 11A through 11D are further graphs of the anti-resonance impedance Zar as a function of distance d in connection with the second embodiment.
Figure 11B:
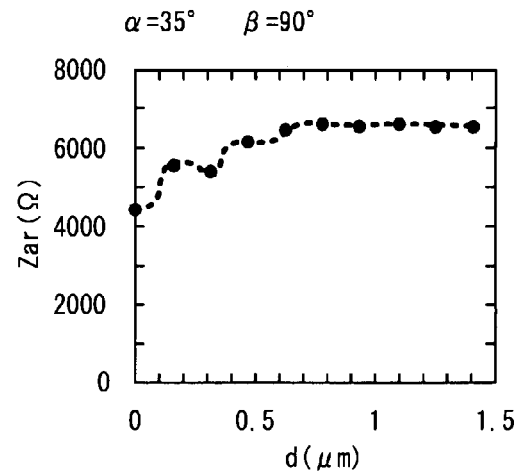
Figure 11C:
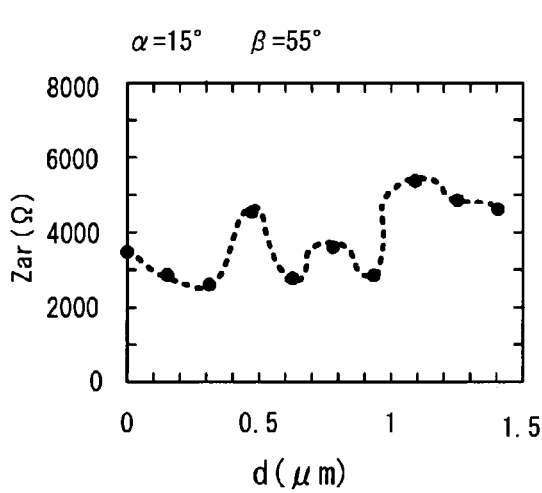
Figure 11D:
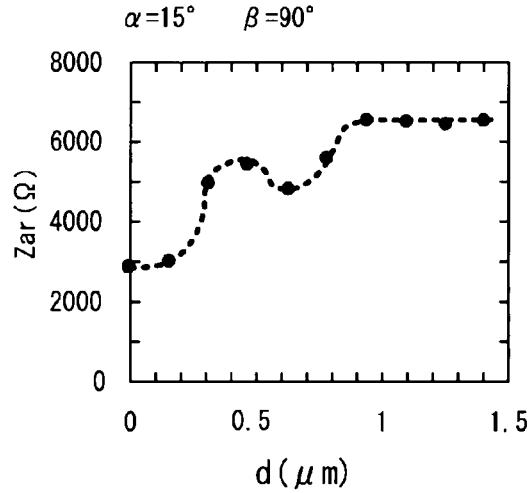

FIG. 10 is a graph of combined results shown in FIGS. 8A through 9D in which the horizontal axis denotes the inner angle $\alpha$, and the vertical axis denotes the anti-resonance impedance Zar. When the inner angle $\alpha$ exceeds 15°, the anti-resonance impedance Zar increases. When the inner angle $\alpha$ exceeds 28°, the anti-resonance impedance becomes approximately constant. In order to restrain the lateral leakage of acoustic waves, it is preferable to set the inner angle $\alpha$ equal to or greater than 15°, and is more preferable to set the inner angle $\alpha$ equal to or greater than 28° and lower than 90°.

Figure 12:
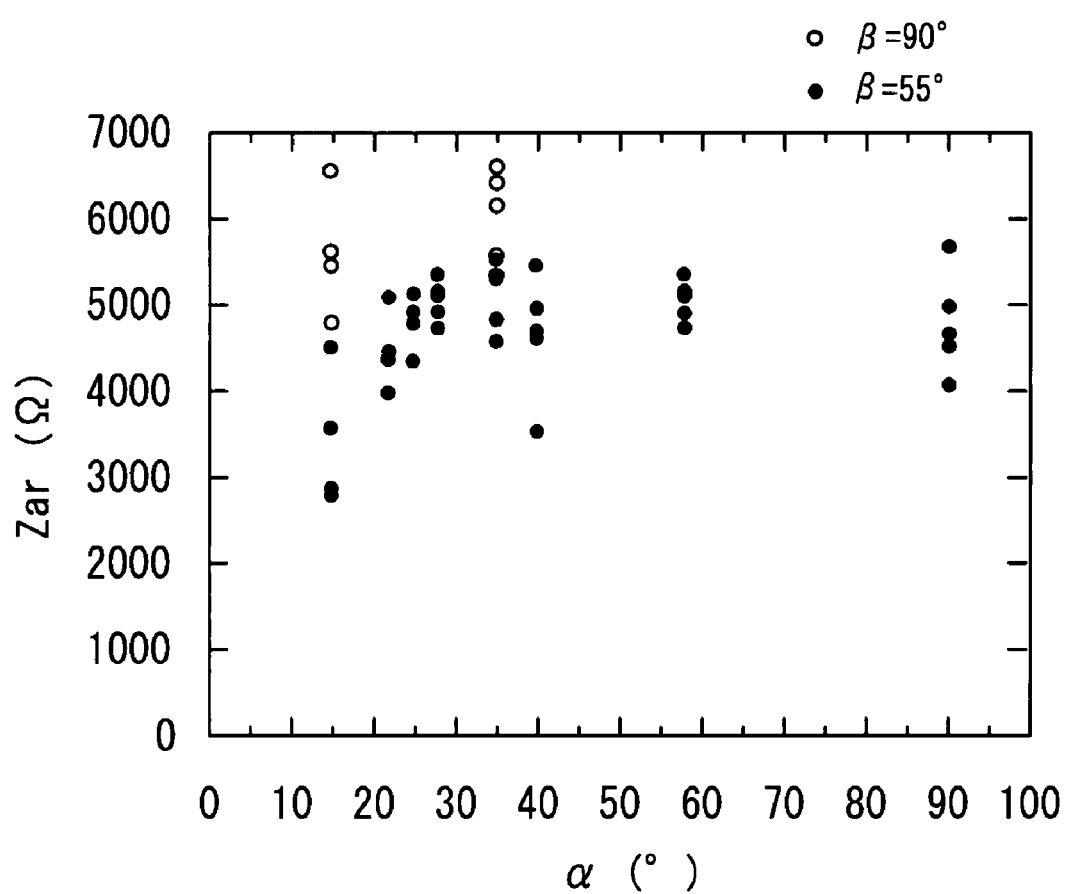
FIG. 12 is a graph obtained by superimposing the results of FIGS. 11A through 11D onto the graph of FIG. 10.

FIGS. 11A through 11D show the results of the computer simulation of the anti-resonance impedance Zar as a function of the distance d for four combinations of $\alpha$ of 35° and $\beta$ of 55°, $\alpha$ of 35° and $\beta$ of 90°, $\alpha$ of 15° and $\beta$ of 55°, and $\alpha$ of 15° and $\beta$ of 90°. The anti-resonance impedance Zar for $\beta$ of 90° is greater than that for $\beta$ of 55°. FIG. 12 is a graph obtained by superimposing the results of FIGS. 11A through 11D onto the graph of FIG. 10. Solid circles are the results obtained for $\beta$ of 55° and outline circles are the results for $\beta$ of 90°. It can be seen from FIG. 12 that the anti-resonance impedance Zar increases when the inner angle $\beta$ changes to 90° from 55°. It is thus preferable to set the inner angle $\beta$ equal to or greater than 55° and is more preferable to set inner angle $\beta$ approximately equal to 90°.

Third Embodiment

Figure 13:
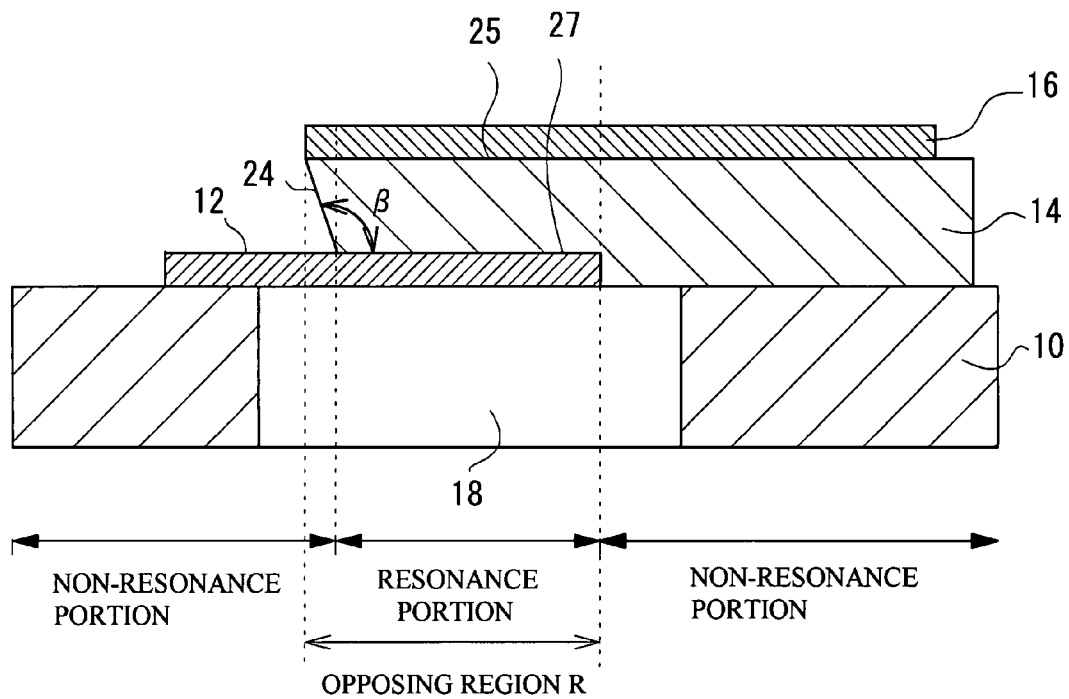
FIG. 13 is a cross-sectional view of a piezoelectric thin-film resonator in accordance with a third embodiment.
Figure 14A:
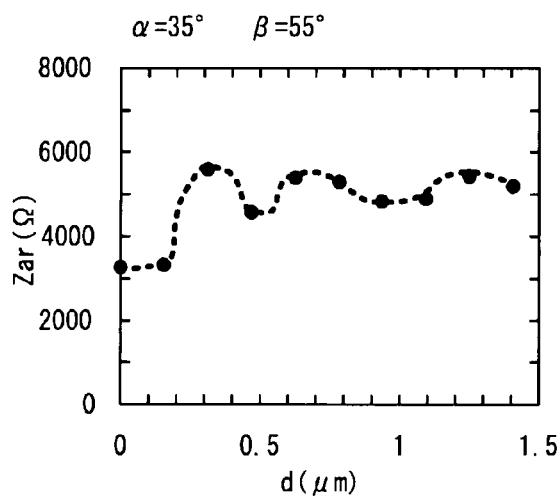
FIGS. 14A through 14D are graphs of anti-resonance impedance Zar as a function of distance d in connection with the third embodiment.
Figure 14B:
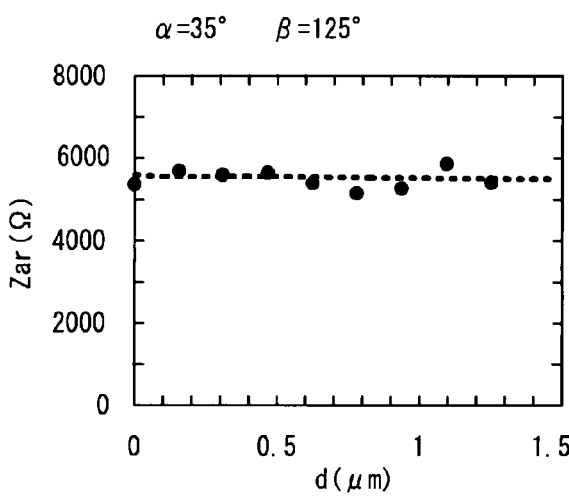
Figure 14C:
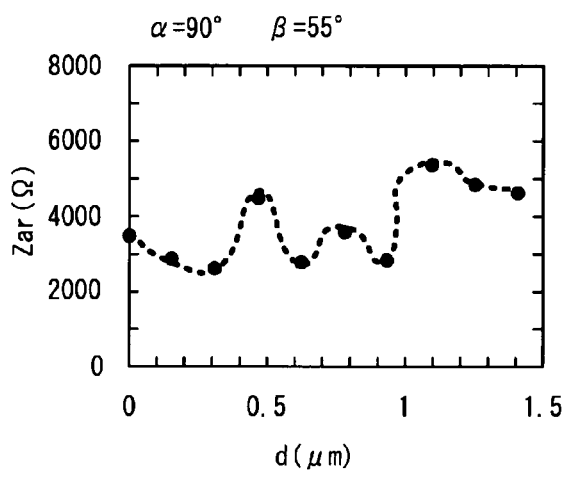
Figure 14D:
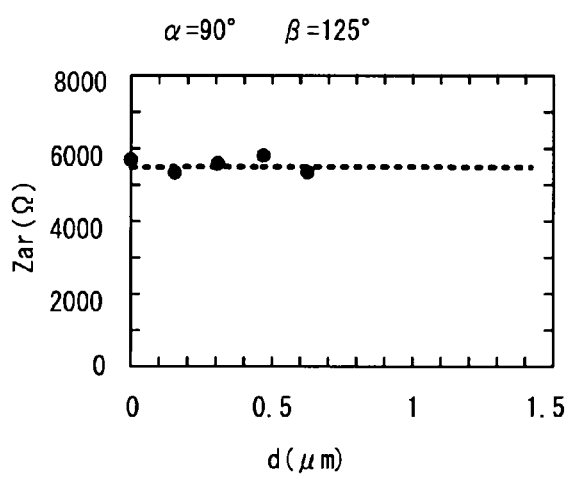

A third embodiment has an arrangement in which a part of the end surface 24 of the piezoelectric film 14 in the region R in which the upper electrode 16 and the lower electrode 12 are opposite to each other across the piezoelectric film 14 is shaped into a reverse taper. Referring to FIG. 13, the inner angle $\beta$ between the end surface 24 of the piezoelectric film 14 and the lower surface 27 thereof is greater than 90°. That is, the end surface 24 of the piezoelectric film 14 is shaped into a reverse taper, which may be defined by etching with ion milling. The other structures of the third embodiments are the same as those of the second embodiment.

FIGS. 14A through 14D show the results of the computer simulation of the anti-resonance impedance Zar as a function of the distance d for four combinations of $\alpha$ of 35° and $\beta$ of 55°, $\alpha$ of 35° and $\beta$ of 125°, $\alpha$ of 90° and $\beta$ of 55°, and $\alpha$ of 90° and $\beta$ of 125°. For $\alpha$ of 35° or 90°, the anti-resonance impedance Zar has a small dependence on the distance d when the inner angle $\beta$ is set equal to 125°, and is thus improved. It is thus preferable to shape the end surface 24 of the piezoelectric film 14 into a reverse taper in which the inner angle $\beta$ is greater than 90°. The third embodiment is capable of increasing Zar even for d of 0 μm.

Fourth Embodiment

Figure 15A:
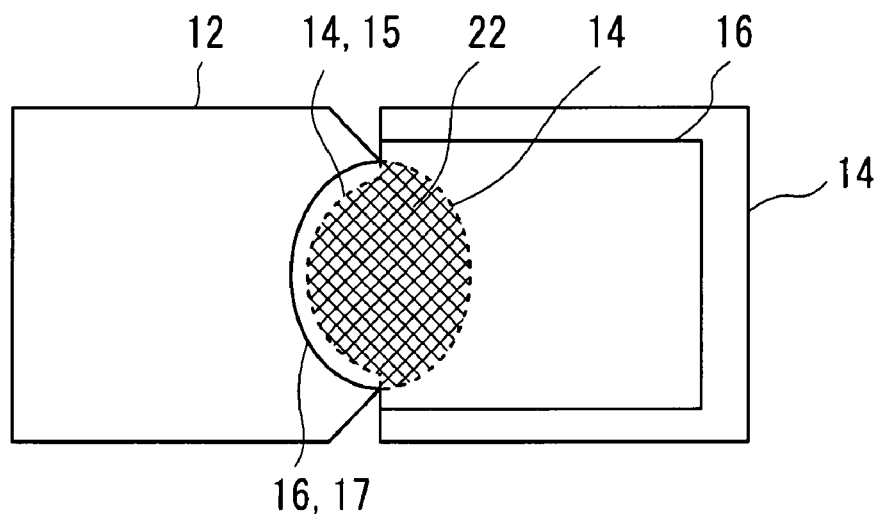
FIGS. 15A and 15B are plan views of piezoelectric thin-film resonators in accordance with a fourth embodiment.
Figure 15B:
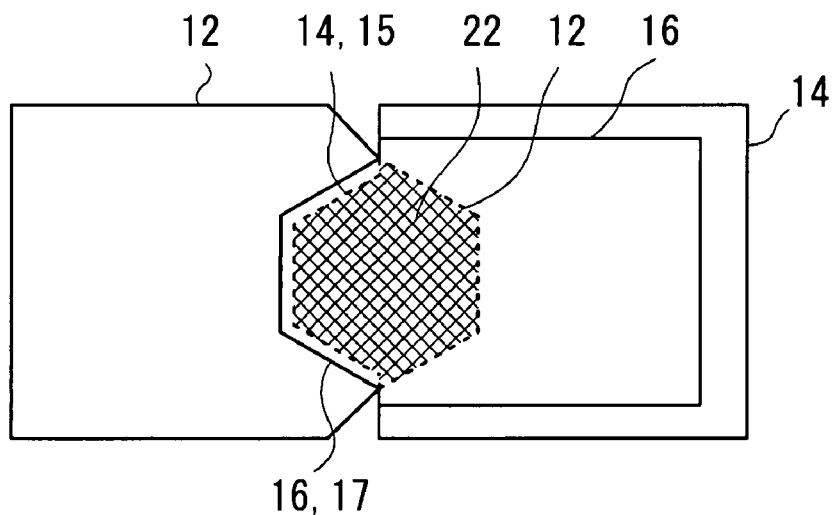

A fourth embodiment is a piezoelectric thin-film resonator in which the resonance portion has an elliptic shape or a polygonal shape. FIGS. 15A and 15B are plan views of piezoelectric thin-film resonators in accordance with the fourth embodiment. FIG. 15A has an exemplary arrangement in which a part of the outer periphery of the resonance portion 22 has a part of an elliptic shape. FIG. 15B has another exemplary arrangement in which the resonance portion 22 has a polygonal shape having anti-parallel sides. The other structures of the fourth embodiment are the same as those of the first embodiment. The fourth embodiment does not have parallel sides. It is thus possible to prevent the acoustic waves reflected by the outer end 15 of the piezoelectric film 14 from existing as lateral standing waves within the resonance portion 22 and to prevent the occurrence of ripples in the pass band.

The substrate 10, the lower electrode 12, the piezoelectric film 14 and the upper electrode 16 of the piezoelectric thin-film resonators of the first through fourth embodiments may be made of the same materials as those described previously. The lower electrode 12 in the resonance portion 22 is located above the cavity 18 formed in the substrate 10. Alternatively, the lower electrode 12 in the resonance portion 22 may be located above the cavity 18 or gap defined on or above the substrate 10. The resonator is not limited to the FBAR type but includes the SMR type. The aforementioned resonators may have another structural element in addition to the structural elements illustrated in the aforementioned figures. For instance, a dielectric film may be provided below the lower electrode 12 as a reinforcement member or an etching stopper layer in the step of forming the cavity 18. Another dielectric film may be provided on the upper electrode 16 as a passivation film or a frequency adjustment film.

Preferably, the piezoelectric film 14 includes aluminum nitride (AlN). The acoustic wave can be propagated through AlN at a high acoustic speed, so that the resonators having a high Q value can be realized. Preferably, at least one of the lower electrode 12 and the upper electrode 16 include a ruthenium (Ru) film. Ruthenium has a high acoustic impedance, which realizes resonators having a high Q value.

Fifth Embodiment

Figure 16:
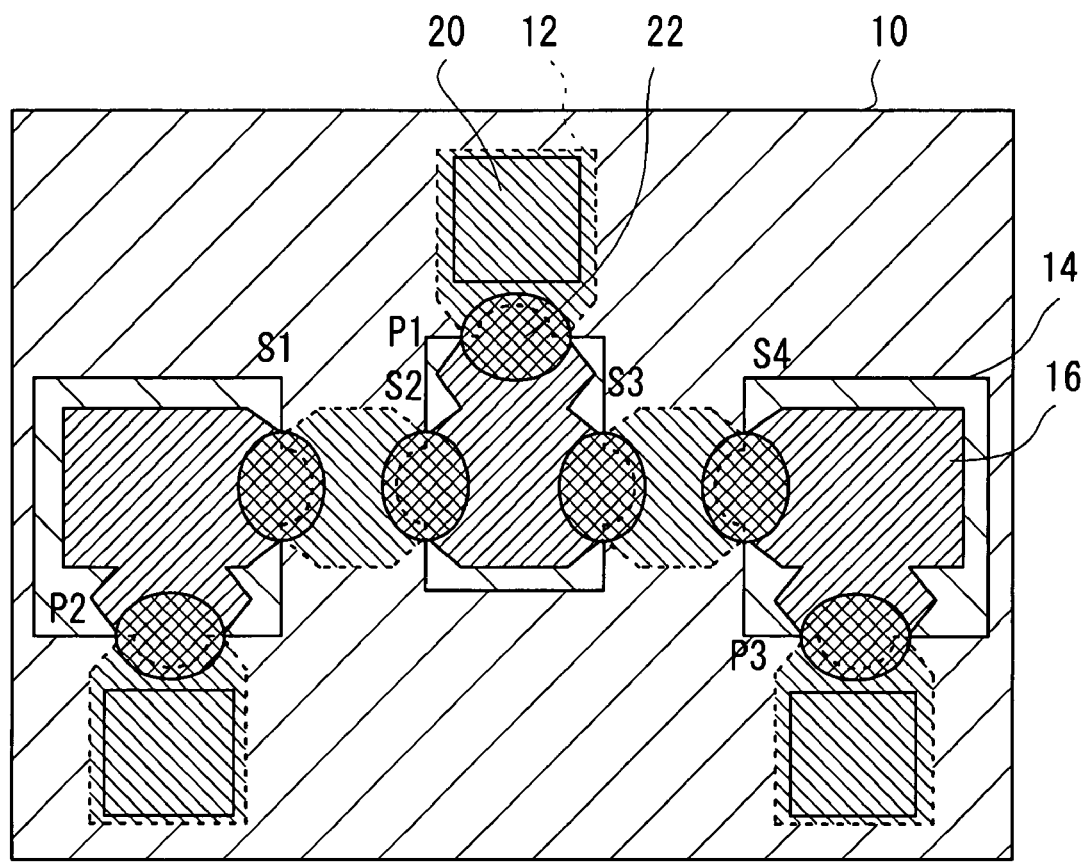
FIG. 16 is a plan view of a filter in accordance with a fifth embodiment.

A fifth embodiment is a filter that includes resonators structured in accordance with the first embodiment. FIG. 16 shows a ladder type filter having series-arm resonators S1 through S4 and parallel-arm resonators P1 through P3, each of which resonators is the piezoelectric thin-film resonator of the first embodiment. The piezoelectric film is provided common to the series-arm resonators S1 through S4 and the parallel-arm resonators P1 through P3. The other structures of the filters are the same as those of the first embodiment. According to the fifth embodiment, it is possible to restrain the lateral leakage of acoustic waves and reduce the loss of the filter. The present invention includes another type of filters having any of the resonators of the aforementioned embodiments.

The present invention is not limited to the specifically disclosed embodiments, but includes other embodiments and variations without departing from the scope of the present invention.

The present application is based on Japanese Patent Application No. 2006-127017 filed on Apr. 28, 2006, the entire disclosure of which is hereby incorporated by reference.

What is claimed is:

1. A piezoelectric thin-film resonator comprising:
a substrate;
a lower electrode provided on the substrate;
a piezoelectric film provided on the lower electrode; and
an upper electrode provided on the piezoelectric film so as to have a portion that overlaps the lower electrode across the piezoelectric film,
at least a part of an outer end of the piezoelectric film of a resonance region being further in than an outer end of an opposing region, wherein:
the opposing region is the region in which the upper and lower electrodes overlap each other; and
the resonance region is a region in which the upper and lower electrodes overlap each other across the piezoelectric film.

2. The piezoelectric thin-film resonator as claimed in claim 1, wherein at least a part of an end surface of the upper electrode that defines the opposing region is inclined to a lower surface of the upper electrode.

3. The piezoelectric thin-film resonator as claimed in claim 2, wherein an inner angle formed by the end surface of the upper electrode and the lower surface thereof is equal to or greater than 15°.

4. The piezoelectric thin-film resonator as claimed in claim 2, wherein an inner angle formed by the end surface of the upper electrode and the lower surface thereof is equal to or greater than 28° but lower than 90°.

5. The piezoelectric thin-film resonator as claimed in claim 2, wherein an inner angle formed by an end surface of the piezoelectric film and a lower surface of the piezoelectric film within the opposing region is equal to or greater than 55°.

6. The piezoelectric thin-film resonator as claimed in claim 1, wherein an outer end of the resonance region has a part of an elliptic shape.

7. The piezoelectric thin-film resonator as claimed in claim 1, wherein an outer end of the resonance region has a polygonal shape having anti-parallel lines.

8. The piezoelectric thin-film resonator as claimed in claim 1, wherein the piezoelectric thin film includes aluminum nitride.

9. The piezoelectric thin-film resonator as claimed in claim 1, wherein at least one of the upper and lower electrodes includes a ruthenium film.

10. The piezoelectric thin-film resonator as claimed in claim 1, wherein the lower electrode is formed above a cavity.

11. A piezoelectric thin-film resonator comprising:
a substrate;
a lower electrode provided on the substrate;
a piezoelectric film provided on the lower electrode; and
an upper electrode provided on the piezoelectric film so as to have a portion that overlaps the lower electrode across the piezoelectric film,
an inner angle formed by an end surface of the piezoelectric film and a lower surface thereof in an opposing region in which the upper and lower electrodes overlap each other is greater than 90°.

12. A filter comprising a resonator, said resonator including:
a substrate;
a lower electrode provided on the substrate;
a piezoelectric film provided on the lower electrode; and
an upper electrode provided on the piezoelectric film so as to have a portion that overlaps the lower electrode across the piezoelectric film,
at least a part of an outer end of the piezoelectric film of a resonance region being further in than an outer end of an opposing region, wherein:
the opposing region is the region in which the upper and lower electrodes overlap each other; and
the resonance region is a region in which the upper and lower electrodes overlap each other across the piezoelectric film.

13. A filter comprising a resonator, said resonator including:
a substrate;
a lower electrode provided on the substrate;
a piezoelectric film provided on the lower electrode; and
an upper electrode provided on the piezoelectric film so as to have a portion that overlaps the lower electrode across the piezoelectric film,
an inner angle formed by an end surface of the piezoelectric film and a lower surface thereof in an opposing region in which the upper and lower electrodes overlap each other is greater than 90°.

* * * * *